(12) United States Patent
Chen

(10) Patent No.: US 6,531,367 B2
(45) Date of Patent: Mar. 11, 2003

(54) METHOD FOR FORMING ULTRA-SHALLOW JUNCTION BY BORON PLASMA DOPING

(75) Inventor: Wei-Wen Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/811,472

(22) Filed: Mar. 20, 2001

(65) Prior Publication Data

US 2002/0137314 A1 Sep. 26, 2002

(51) Int. Cl.[7] .................. H01L 21/26; H01L 21/42; H01L 21/425; C23C 16/00; A61N 5/00; G21G 5/00
(52) U.S. Cl. .................. 438/305; 438/516; 118/723 E; 250/492.2
(58) Field of Search .................. 438/513, 516; 118/723 E; 250/492.2

(56) References Cited

U.S. PATENT DOCUMENTS 5,330,800 A * 7/1994 Schumacher et al. ....... 427/523
5,354,381 A * 10/1994 Sheng
5,561,072 A * 10/1996 Saito
5,572,038 A * 11/1996 Sheng et al. ........... 250/492.21
5,969,398 A * 10/1999 Murakami
6,165,376 A * 12/2000 Miyake et al. ................ 216/67

* cited by examiner

Primary Examiner—John F. Niebling
Assistant Examiner—Ron Pompey
(74) Attorney, Agent, or Firm—Rosenberg, Klein & Lee

(57) ABSTRACT

A method for forming an ultra-shallow junction by boron plasma doping is disclosed. A substrate is placed in a pulse type electric field. A flowing carrying gas drives boron ions in a channel above the substrate, and then a negative pulse type voltage is applied so that the boron ions may uniformly enter into the substrate. Then a rapid annealing process is performed so as to be formed with an ultra-shallow junction on the substrate. In the present invention, by the boron plasma doping, an ultra-shallow junction is provided on a surface of the substrate. Therefore, after the next thermal process, the property of the element can be retained. A lower depth junction is acquired, and the diffusion in the horizontal direction is suppressed.

6 Claims, 2 Drawing Sheets

METHOD FOR FORMING ULTRA-SHALLOW JUNCTION BY BORON PLASMA DOPING

FIELD OF THE INVENTION

The present invention relates to a method of ion plantation, and especially to a method for forming an ultra-shallow junction by boron plasma doping.

BACKGROUND OF THE INVENTION

With the progress of semiconductor elements, the manufacturing of semiconductor elements are more and more precise and therefore, the depth distribution of impurity atoms are more and more precise. In general, an ion planting method is used to precisely control the depth and concentration distributions of impurity atoms. In the process of ion planting, the impurity atoms with a form of charged ions are accelerated to have an energy and then they can collide the silicon wafer directly to enter into a proper position in the crystal lattices. Therefore, the depth distribution of the ions can be controlled by the energy of the ion, while the dose of the impurity atoms can be controlled by the planting time and current of the ion beam.

In the prior art, the charged ions as an ion beam with certain energy is planted into a silicon wafer by using an ion planter. Then, a thermal processing is used to repair the damage due to ion planting and thus, a required electric active function is achieved. In order to suppress a short channel effect, the angle between a chip and an incident ion beam must be adjusted properly. In general, the tilt angle used is about 7 degrees, and the chip is a specific twist angle for increasing the possibility of collision of the ion beam and silicon atoms. This way of injecting the ion beams one by one need a longer time and ions can not be uniformly distributed on the wafer, moreover, the tilt angle of the wafer must be controlled precisely. Moreover, when the line width of the device is required to be reduced to be below 0.18 $\mu$m, and area of each section, including source and drain, in the metal oxide semiconductor (MOS) must also be reduced, and thus the diffusing depth of the junction must be controlled severely for reducing the short channel effect and the punch-through effect. Therefore, an ion doping with a further lower energy and a rapider thermal process are used. However, when the energy of ion-planting is lower than 1 KeV, the ion current will be over-low, and thus the product will be reduced greatly. As a consequent, the trend of increasing the product in unit dustless area can not be performed. Furthermore, due to the reduction of areas of semiconductor elements, the electricity for planting ion pair elements to a wafer opaquely will be affected greatly. Further, since a lower energy and high does ion plantation, the amorphous ion plantation can not acquire an effect of shallow plantation to the ion energy ion plantation. On the contrary, one more manufacturing process will reduce the amount of products so that the aforesaid method can not meet a manufacturing process below 0.1 $\mu$m.

Therefore, the object of the present invention is to disclose a method for manufacturing an ultra-shallow junction so as to resolve the aforesaid problem.

SUMMARY OF THE INVENTION

Accordingly, the primary object of the present invention is to provide a method for forming an ultra-shallow junction by boron plasma doping for acquiring a flat and uniform ultra-shallow junction. Therefore, after the next thermal process, the property of the element can be retained. A lower depth junction is acquired, and the diffusion in the horizontal direction is suppressed.

Another object of the present invention is to provide a method for forming an ultra-shallow junction by boron plasma doping, wherein boron ions is completely near the surface of the wafer substrate. The damage to the wafer substrate is reduced. This is beneficial to the re-crystallization in the thermal process.

According to the present invention, a substrate is placed in a pulse type electric field. A flowing carrying gas drives boron ions in a channel above the substrate, and then a negative pulse type voltage is applied so that the boron ions may uniformly enter into the substrate. Then a rapid annealing process is performed so as to be formed with an ultra-shallow junction on the substrate.

The various objects and advantages of the present invention will be more readily understood from the following detailed description when read in conjunction with the appended drawing.

DETAILED DESCRIPTION OF THE PREFERRED EMBODIMENTS

The feature of the present invention is to plant boron ions into silicon wafer from a boron plasma through an impulse way, and then through a rapid thermal annealing process, an ultra-shallow junction structure is formed as a lower resistance junction between the source and drain of a MOS transistor.

Figure 1:
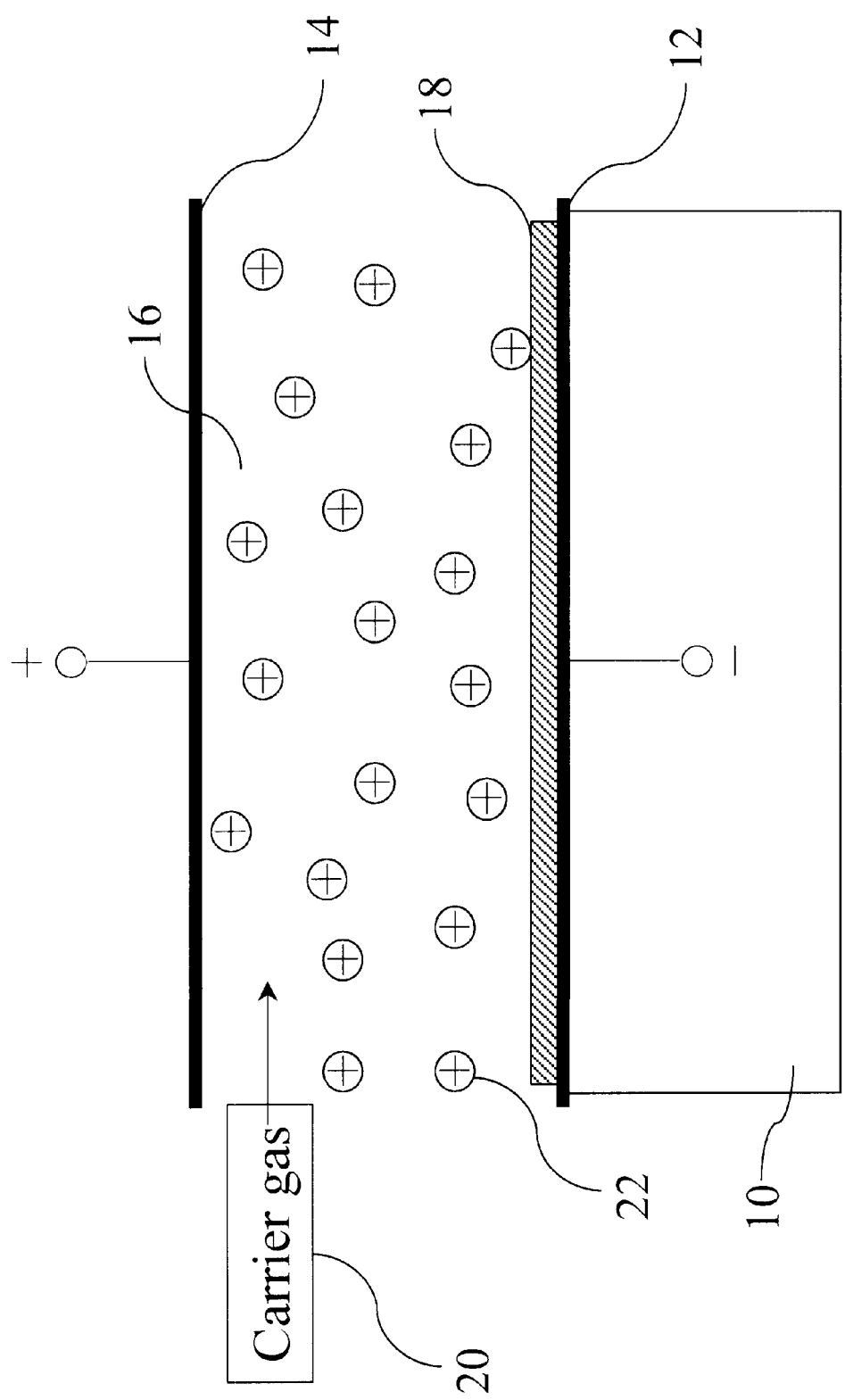
FIG. 1 is a schematic view for performing the present invention.

With reference to FIG. 1, in order to provide an electric field, a lower electric plate 12 is installed on the seat 10 for being connected to a negative voltage. An upper electric plate 14 is installed above the lower electric plate 12 and is parallel to the lower electric plate 12. A channel 16 is formed between the upper electric plate 14 and the lower electric plate 12. When an ion planting process is performed on the silicon substrate 18. The silicon substrate 18 is firstly placed on the seat 10. Then carrying gas 20, generally argon gas, is used to carry boron plasma 22 to flow. The carrying gas 20 has a finite flowing speed so that the boron plasma 22 are filled sufficiently in the channel 16 between the lower electric plate 12 and upper electric plate 14. A positive voltage is applied to the upper electric plate 14, and a pulse type negative voltage is applied to the lower electric plate 12 so that the boron ions 22 above the silicon substrate 18 will dope into the silicon substrate 18 along the direction of electric field so that an ultra-shallow junction of a uniform and flat amorphous silicon is formed.

The planting energy of the boron ions 22 is about 220 eV~10 KeV. These implanted high energy ions will has a certain destroy to the silicon layer on the surface of the silicon substrate 18 so that the original crystallized silicon arranged with a fixed pattern are destroyed to become amorphous silicon without fixed pattern. In order to resolve the problem of amorphous silicon on the surface of the silicon substrate 18 after planting boron ions 22, in general, the silicon substrate 18 is through a rapid thermal annealing process under a temperature of about 1000~2000° C. so that the amorphous silicon ultra-shallow junction restores to the original crystallized condition and thus the ultra-shallow junction of silicon substrate 18 as a lower resistance junction between the source and drain is accomplished, the junction has properties of lower resistance, shallow depth in junction and suppressing the diffusing in horizontal direction.

Figure 2:
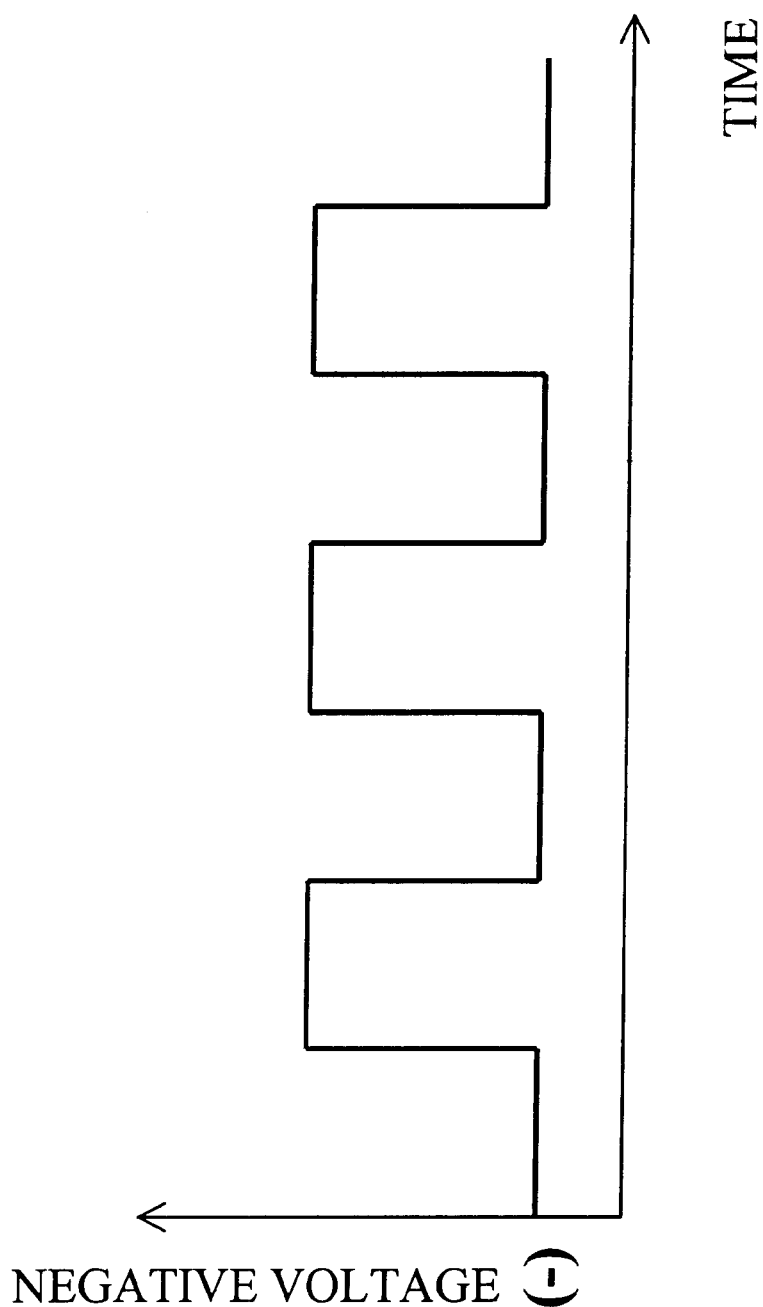
FIG. 2 is a schematic view of the negative pulse voltage in the present invention.

When the boron plasma 22 in the channel 16 is attracted by the negative voltage of the lower electric plate 12 due to the function of the electric field, all ions will enter into the silicon substrate 18 and uniformly distributed therein. Now, since the consumption of boron ions 22, and the flowing carrying gas 20 does not cause the channel 16 to be filled sufficiently with boron ions 22. A null space is formed in the channel 16 above the silicon substrate 18. If now a voltage is continuously applies to between the upper electric plate 14 and lower electric plate 12, all the boron ions 22 will be attracted by the lower electric plate 12 once these boron ions 22 enter into the channel 16 so as to be doped into a front section of the silicon substrate 18 and can not enter into the silicon substrate 18 in full surface, so that the distribution of the boron ions are not uniform. Referring to FIG. 2, therefore, a pulse form negative voltage is used. In that, the supplying of negative voltage is stopped temporarily, until the carrying gas 20 drive the boron ions 22 to be fully and uniformly distributed in the channel 16 above the silicon substrate 18, and then a negative voltage is applied to the lower electric plate 12 for the next ion plantation. As a result, a uniform ion plantation is achieved.

Therefore, comparing with the prior art low energy ion plantation, in the present invention, by adding boron plasma to be formed with a ultra-shallow junction, the present invention has the following advantages:

(1) A further shallow junction: In order to match the requirement of SIA-roadmap, when the line width of an element is below 0.1 μm, a depth of 200–400 angstrom is achieved. The boron plasma of the present invention provides a depth of smaller than 100 angstrom.

Therefore, the following thermal process will not diffuse the boron ions into an undesired depth. Consequently, the diffusing depth of the boron ions can be controlled severely, and the punch-through and short channel effects are reduced greatly.

(2) Maintaining the properties of the elements: in a higher energy, a tilt planting to a wafer may acquire a shallower junction and higher ion current, while a defect of low speed is formed. Moreover, since the tilt implantation, the extending diffusing areas of the source and drain will enter a section below the gate so that the electricity is affected greatly, while the present invention has no such a problem and thus, the properties of elements are maintained.

(3) The damage to the surface of a wafer is reduced: since the dose of boron ions is completely near the surface of the wafer substrate.

The damage to the wafer substrate is reduced. This is beneficial to the re-crystallization in the thermal process. Only a thinner amorphous silicon on the surface is formed and thus the thermal budget required is much smaller, and therefore, the repairing work is convenient.

The present invention are thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for forming an ultra-shallow junction by boron plasma doping, an ultra-shallow junction being formed on a substrate as a low resistance junction between a source and a drain of a metal oxide semiconductor (MOS), comprising the steps of:

providing a seat;

installing two parallel upper and lower electric plates above said seat;

placing a substrate on said seat;

driving a boron plasma by a carrying gas into a channel defined between said upper and lower electric plates; and applying a positive voltage to said upper electric plate and maintaining said positive voltage of a predetermined level thereof, and applying a pulse type negative voltage to said lower electric plate to facilitate the boron ions implantation into said substrate to form the ultra-shallow junction therein.

2. The method as claimed in claim 1, wherein said substrate is silicon wafer.

3. The method as claimed in claim 1, wherein an energy of planting boron ion is in a range of 220 eV~10 KeV.

4. The method as claimed in claim 1, wherein after the step of forming an ultra-shallow junction, a rapid annealing process is formed so that the ultra-shallow junction restores to the original crystal condition.

5. The method as claimed in claim 4, wherein the temperature of annealing is in a range of 1000–2000 degree C.

6. The method as claimed in claim 1, wherein said carrying gas is argon gas.

* * * * *